(12) United States Patent
Sim (10) Patent No.: US 7,378,910 B2
(45) Date of Patent: May 27, 2008

(54) POWER AMPLIFIER FOR A TRANSMITTER

(75) Inventor: Dae-Hyun Sim, Seoul (KR)

(73) Assignee: Samsung Electronics Co., Ltd (KR)

( * ) Notice: Subject to any disclaimer, the term of this patent is extended or adjusted under 35 U.S.C. 154(b) by 192 days.

(21) Appl. No.: 11/128,914

(22) Filed: May 12, 2005

(65) Prior Publication Data

US 2006/0066411 A1    Mar. 30, 2006

(30) Foreign Application Priority Data

Sep. 24, 2004    (KR) .................. 10-2004-0077250

(51) Int. Cl.
*H03F 3/68* (2006.01)

(52) U.S. Cl. ..................................... 330/302; 330/311

(58) Field of Classification Search ................ 330/302, 330/310, 311
See application file for complete search history.

(56) References Cited

U.S. PATENT DOCUMENTS 4,588,956 A * 5/1986 de Corlieu et al. ............. 330/2
6,445,250 B1 * 9/2002 Aude ......................... 330/253

* cited by examiner

*Primary Examiner*—Steven J. Mottola
(74) *Attorney, Agent, or Firm*—The Farrell Law Firm, PC (57) ABSTRACT

A power amplifier for a transmitter includes a plurality of CMOS amplifiers of different types which are serially and alternately connected, and matching circuits for matching impedance discrepancies between the CMOS amplifiers of different types.

8 Claims, 7 Drawing Sheets

POWER AMPLIFIER FOR A TRANSMITTER

PRIORITY

This application claims priority to an application entitled "POWER AMPLIFIER FOR A TRANSMITTER" filed in the Korean Industrial Property Office on Sep. 24, 2004 and assigned Serial No. 2004-77250, the contents of which are hereby incorporated by reference.

BACKGROUND OF THE INVENTION

1. Field of the Invention

The present invention relates to a terminal of a mobile communication system, and more particularly to a power amplifier for a transmitter of a mobile communication terminal.

2. Description of the Related Art

A transmitter of a mobile communication terminal usually includes a power amplifier. CMOS (Complementary Metal-Oxide Semiconductor) technology has enabled on-chip integration of the power amplifier, which has made a contribution to minimize BOM (Build on Materials) and areas for mounting devices (i.e., footprints). Also, the on-chip integration technology of the power amplifier has allowed not only for the elimination of the requirement that the substrates and the common mode noises thereon by fully differential (pseudo) structure thereof, but also to reduce the PAPR (Peak-to-Average Power Ratio), for example, voltage of 3 dB and power of 6 dB. Besides, through the on-chip integration technology, it is still possible to minimize non-linearity caused by the influence of the PAPR when the voltage levels are equal (i.e. equal consumption power).

In addition to the on-chip integration technology, an on-chip balun transformer for use as an antenna interface may be applied to the power amplifiers. This allows to further reduce losses as compared with the discrete devices usually mounted in the outside.

It has been difficult to realize the conventional power amplifiers by the COMS technology because the power amplifiers based on the CMOS technology require relatively larger currents for obtaining a desired gain. In recent years, however, as the ωC in the impedance has greatly increased in light of the reduced channel lengths in the CMOS, the use of the power amplifiers of the CMOS type is increasing in fields of wireless LAN and mobile communication (for high frequency).

Other types of power amplifiers in the prior art consist of power amplifiers of GaAs (MESFET) and InPGaAs types which require relatively little current as compared with those of CMOS type but are expensive due to the lower yields thereof. It is also difficult to realize the amplifiers of the GaAs type and the InPGaAs type in the form of Si system-on-chip because they are manufactured by using none-silicon materials. It is still another problem that differential structures used in the GaAs and the InPGaAs employ discrete baluns outside of the structure, which increase the footprints and loss.

As described above, the conventional power amplifiers of the GaAs type and the InPGaAs type are expensive and have a low yield. In the conventional power amplifiers of the CMOS type, it is difficult to obtain the necessary gain for a relevant current due to the low trans-conductance thereof. Furthermore, the conventional power amplifiers generate considerable spurs (e.g., harmonics and IM—Intermodulation) although they are square-low devices. Also, the conventional power amplifiers have a single-ended (antenna interface) structure, so that the conventional power amplifiers do not have sufficient voltage swings based on a fixed power supply voltage and thus fail to provide effective electrical power to the final output loads.

According to reduction in the channel interval in CMOS technology, an available frequency range in CMOS has gradually increased so that it has become possible to supply sufficient electrical power (not more than 0.35 um thereof), and to design and realize the power amplifiers in the form of on-chip through the CMOS process.

Figure 1:
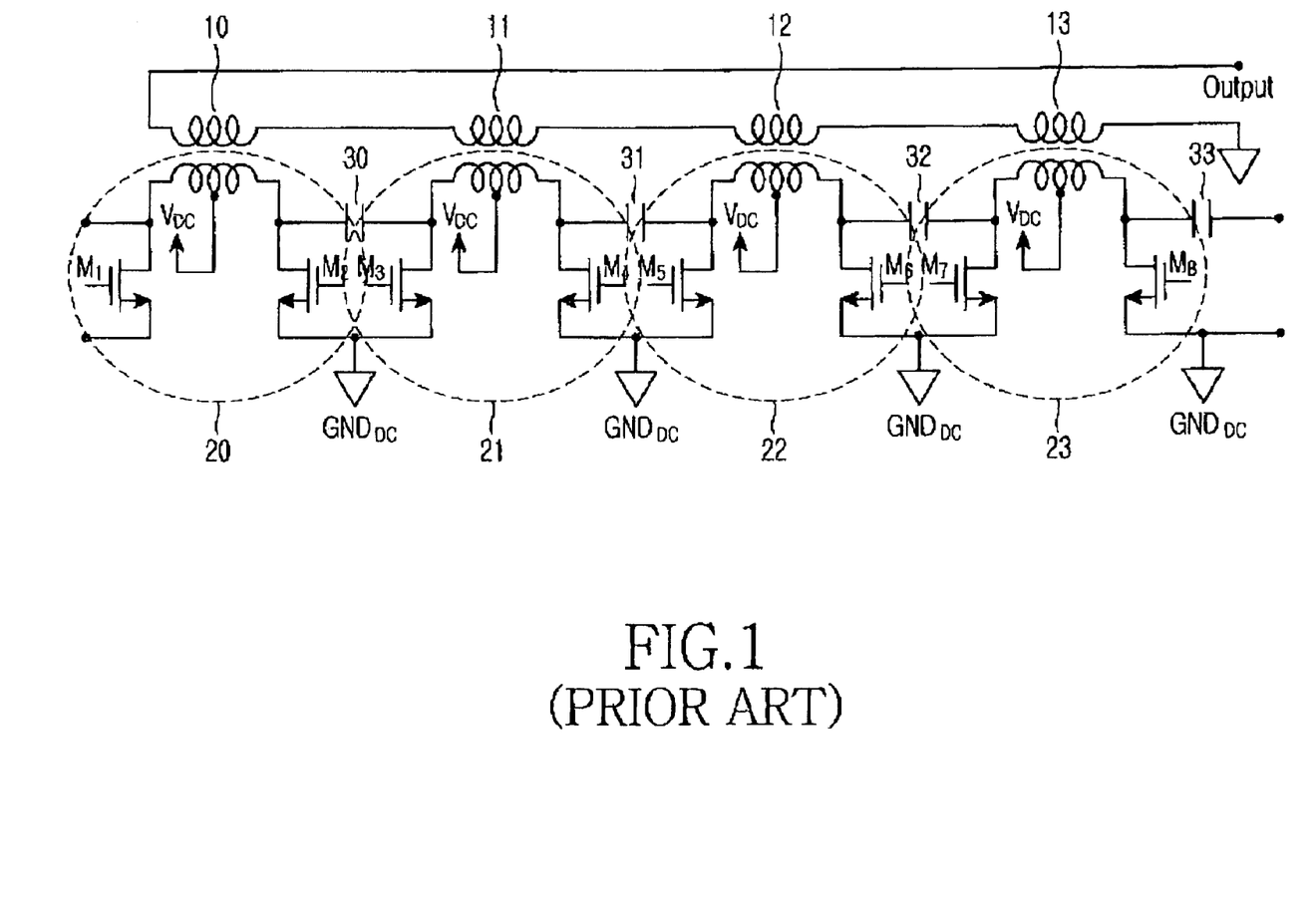
FIG. 1 is a schematic diagram of a power amplifier embodied by a CMOS according to a prior art.

FIG. 1 is a schematic diagram of the conventional power amplifier using the CMOS technology according to the prior art. The conventional power amplifier of the CMOS type includes at least one differential amplifier 20 to 23 of the same type. The differential amplifiers 20 to 23 are similar to the well-known existing differential amplifiers. The conventional power amplifier includes transformers 10 to 13 which are connected to the outputs of the amplifier and correspond to the differential amplifiers 20 to 23. The conventional power amplifier of the CMOS type, which generates a desired output level by stacking the voltages charged in capacitors 30 to 33 through the transformers 10 to 13, requires at least four differential amplifiers 20 to 23. The conventional power amplifier converts each output (current) of the differential amplifiers into a voltage through the transformers 10 to 13 (differential to single ended) instead of the typical cascading stages, and then adds it to a voltage stacked in an inductor which is a part of each transformer.

However, the output of the conventional power amplifier of the CMOS type is insufficient to satisfy the design specifications required in the mobile communication devices. Further, in a state where the power amplifier of the single-in/out type prevails in the art, the power amplifier of the differential type which can be directly adapted to the outputs of an input stage transceiver (in the form of IC) is also problematic in that the voltage swing may half-reduce and consequently the saturation voltage may half-reduce.

SUMMARY OF THE INVENTION

Accordingly, the present invention has been made to solve at least the above-mentioned problems occurring in the prior art, and an object of the present invention is to provide a power amplifier for a transmitter, which can solve the above-mentioned problems of the prior art.

It is another object of the present invention to provide a power amplifier for a transmitter that can meet the design specifications required in mobile communication devices with respect to its output, sufficient voltage swing can be effectively obtained at a fixed power source voltage, ACLR (Adjacent Channel Leakage Ratio) and a distortion generated in output signals of each stage in the differential amplifiers can be remarkably reduced to obtain higher linearity, and the on-chip balun or an equivalent thereof can be embodied.

In order to accomplish this object, there is provided a power amplifier for a transmitter that includes a plurality of CMOS amplifiers of different types which are alternately interlinked in the form of cascading connection; and matching circuits for matching impedance discrepancies between the CMOS amplifiers of different types.

In accordance with another aspect of the present invention, there is provided a power amplifier that includes a NMOS amplifier of a first stage; a PMOS amplifier of a second stage; and a NMOS amplifier of a third stage, wherein the amplifiers of the first stage, the second stage, and the third stage are sequentially interlinked in a form of cascading connection.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENT

Hereinafter, preferred embodiments of the present invention will be described with reference to the accompanying drawings. In the following description, a detailed description of known functions and configurations incorporated herein will be omitted when it may make the subject matter of the present invention rather unclear.

Figure 2:
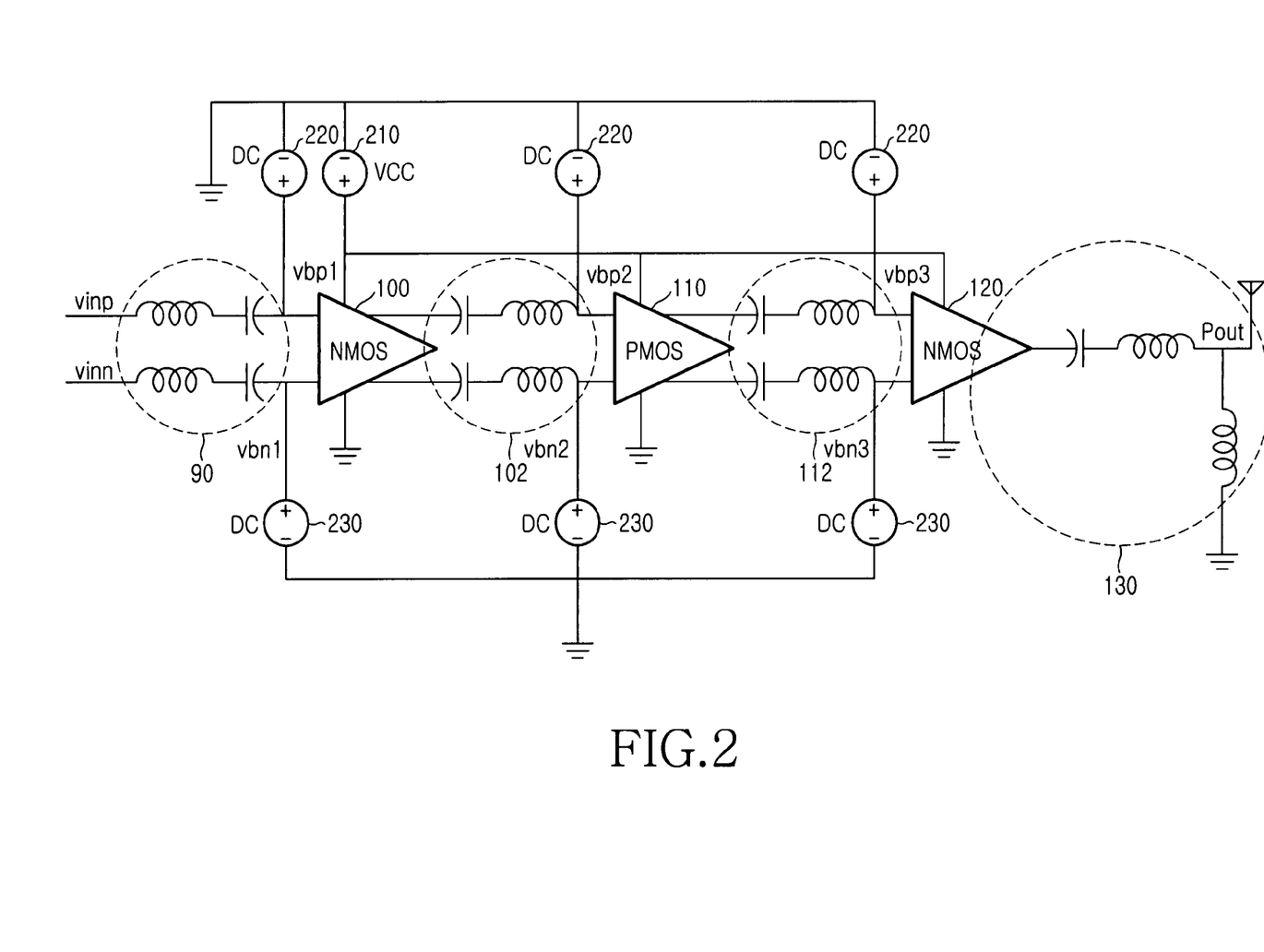
FIG. 2 is a schematic diagram of a power amplifier for a transmitter according to one embodiment of the present invention.
Figure 3:
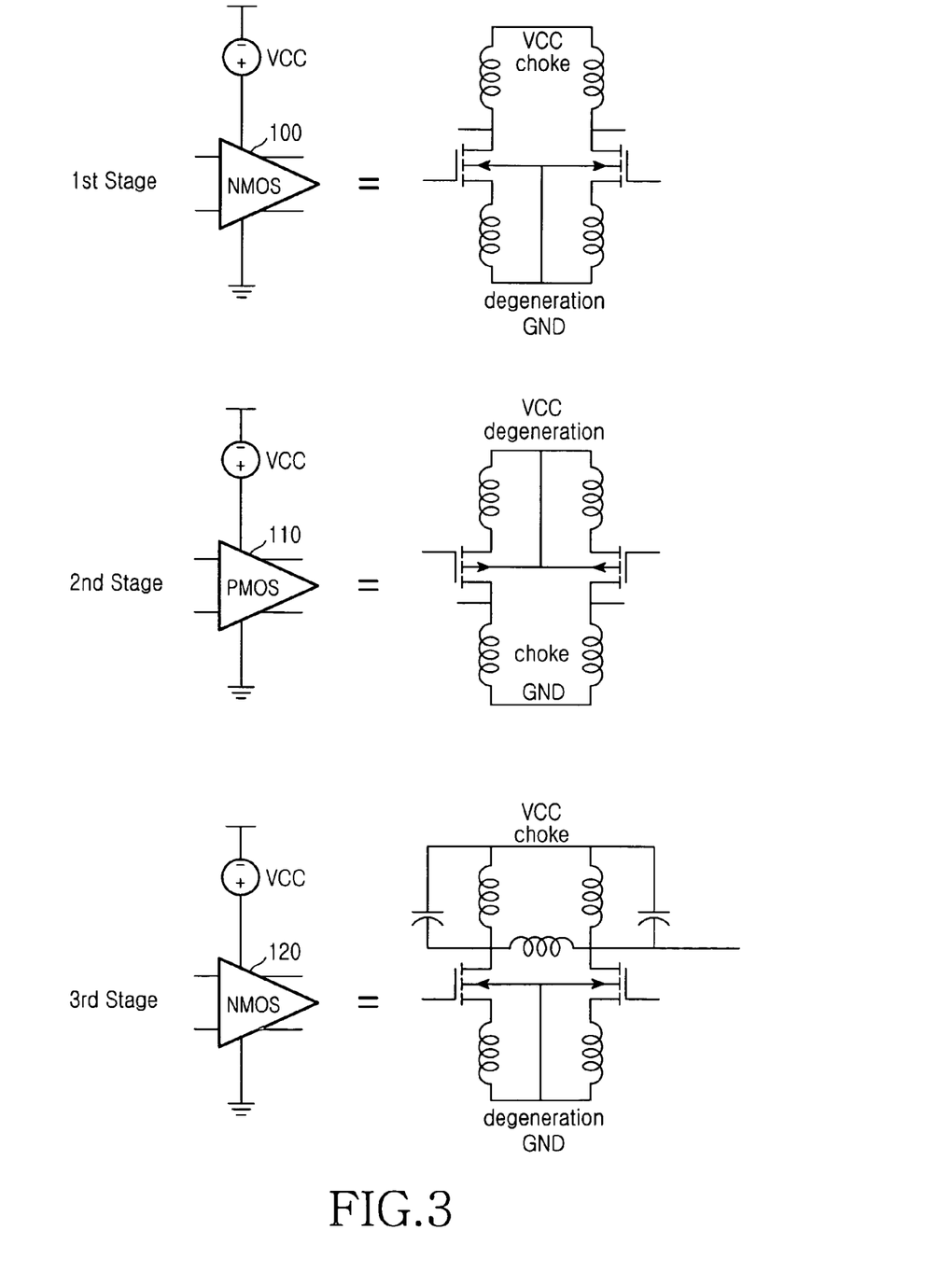
FIG. 3 is a schematic diagram of each stage in the power amplifier according to one embodiment of present invention respectively.

FIG. 2 is a schematic diagram of the power amplifier for the transmitter according to one embodiment of the present invention, and FIG. 3 is a schematic diagram of each stage in the power amplifier according to one embodiment of present invention.

The present invention provides a power amplifier having a Si-CMOS pseudo-differential structure. Referring to FIG. 2, the power amplifier according to an embodiment of the present invention includes three pseudo-differential amplifiers 100, 110 and 120 which correspond to an NMOS amplifier 100, a PMOS amplifier 110 and an NMOS amplifier 120. These three amplifiers 100, 110 and 120 are interlinked in the form of cascading connection. Referring to FIG. 3, the NMOS amplifiers 100 and 120 of the first and the third stages have a polarity opposite to that of the PMOS amplifier 110 of the second stage. The reason why the NMOS amplifiers 100 and 120 and PMOS amplifier 110 are arranged alternatively, is that such a structure can effectively prevent voltage swings in each stage of the power amplifier. As a result, any distortion of the output waveforms can be minimized in the power amplifier of present invention.

Figure 4A:
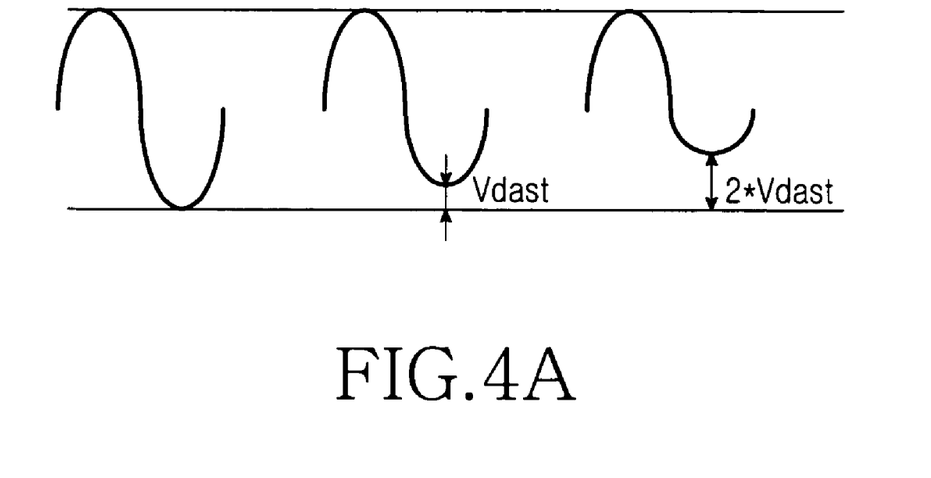
FIGS. 4A and 4B are diagrams for comparing voltage swings in the power amplifiers according to both prior art and one embodiment of present invention.
Figure 4B:
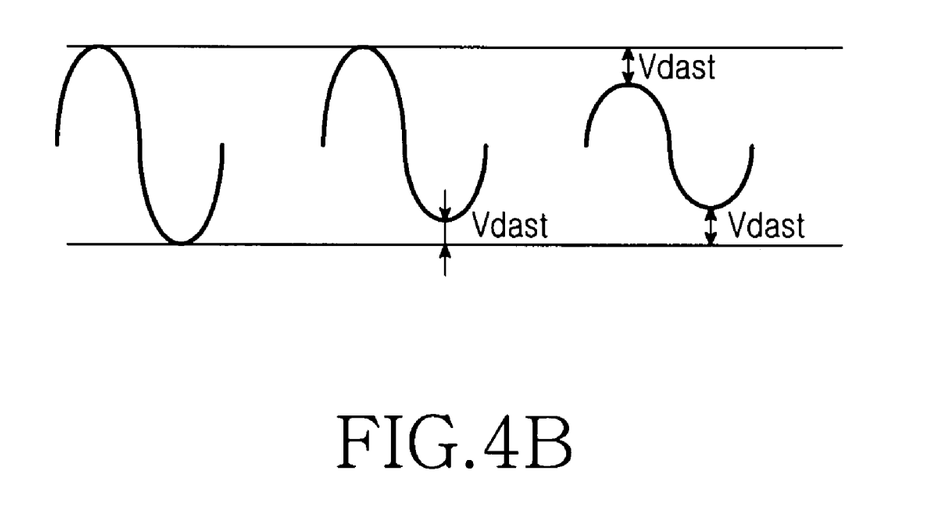

Referring to FIG. 4, the voltage swings in the power amplifier of present invention are compared with those of conventional power amplifier. FIG. 4a shows voltage swings in the conventional power amplifier, and FIG. 4B shows voltage swings in the power amplifier of present invention. Since the conventional power amplifier as shown in FIG. 1 has NMOS amplifiers 20 to 23 of the same type, each time input signals of the conventional power amplifier pass through NOMS amplifier of each stage, they go through distortions in resultant waveforms thereof to a degree corresponding to a magnitude of a threshold voltage across a transistor of each NMOS amplifier. More specifically, referring to FIG. 4A, whenever any input signal passes through the NMOS amplifiers, the resultant output signal thereof has distortions concentrated on only one side (negative side) of both negative and positive of DC power source voltage.

To the contrary, the power amplifier of present invention has MOS amplifiers of different types which are alternately disposed. That is, the PMOS amplifier 110 of the second stage has a polarity opposite to that of the NMOS amplifier 120 of the third stage. Therefore, when the input signals of the power amplifier pass through the PMOS amplifier 110 and the NMOS amplifier 120, the resultant output signals thereof have the distortions evenly distributed on the both negative and positive sides of the DC power source voltage, as shown in FIG. 4B.

FIGS. 4A and 4B simply illustrate a relationship between the input signals and the output signals in a variable pattern of a constant number. Practically, however, as the input signals of the power amplifier pass through the stages thereof, they are subject to further distortions in more complex pattern caused not only by the threshold voltages of transistors but also by IM—Intermodulation and harmonics thereof. Therefore, the alternate arrangement of the MOS amplifiers of different type according to present invention can make a great contribution to reduce the distortions generated in each stage thereof. Accordingly, the power amplifier of present invention is superior to those of prior art in respect to their ability to suppress distortions of the resultant output signals.

Figure 5:
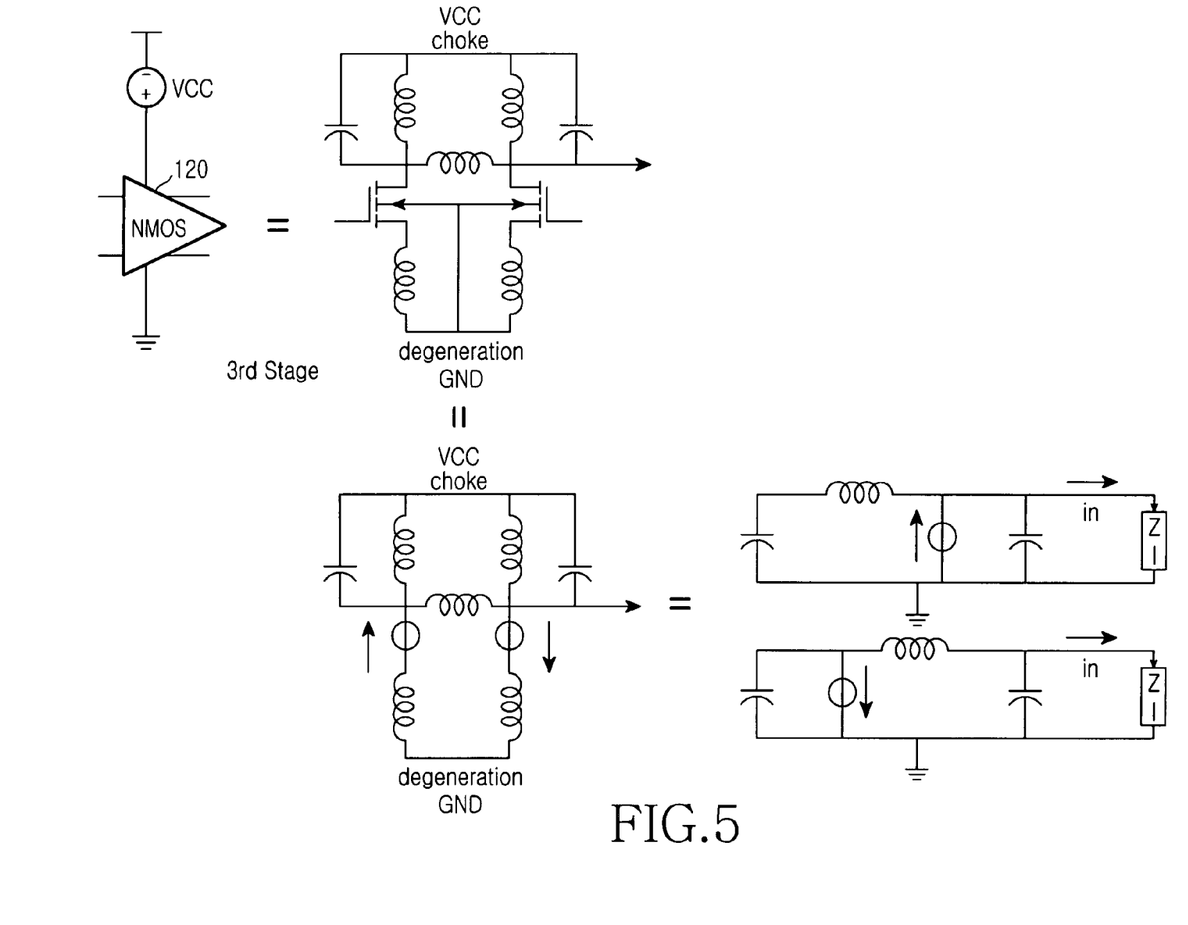
FIG. 5 is a schematic diagram of an amplifier of a stage connected to output of the power amplifier according to one embodiment of present invention.

Returning to FIG. 2, the power amplifier of present invention includes matching circuits 90 connected between inputs vinp and vinn and the NMOS amplifier 100, and a matching circuit 130 connected between the NMOS amplifier 120 and an output Pout. The power amplifier of present invention further includes a matching circuit 102 connected between the NMOS amplifier 100 of the first stage and the PMOS amplifier 110 of the second stage, and a matching circuit 112 connected between the PMOS amplifier 110 of the second stage and the NMOS amplifier 120 of the third stage. Each of the MOS amplifiers 100, 110 and 120 receives power from a power source 210. Specifically, each of the MOS amplifiers 100, 110 and 120 receives positive inputs vbp1 to vbp3 from at least one DC power sources 220 for supplying a positive DC power and receives negative inputs vbn1 to vbn3 from at least one DC power sources 230 for supplying a negative DC power. In accordance with one embodiment of present invention, the power amplifier has the NOMS amplifier 120 of the third stage which does not require a discrete, not-on-chip-based balun device usually included in a transmitter of prior art. FIG. 5 illustrates such a NMOS amplifier 120 of the third stage.

Referring to FIG. 5, the NOMS amplifier 120 of the third stage includes a circuit composed of capacitors and inductors.

Assuming that a current flowing through a load of NMOS amplifier 120 is ip+in, the value of which can be expressed as Equation 1:

$$i_p + i_n = 2i_p - 3i_c - i_{LC} \tag{1}$$

A condition for maximizing the overall output current can be expressed as Equation 2:

$$-3i_c - i_{LC} = 0,$$ (2)

$$3 \cdot j\omega C = -\frac{1}{j\omega L + \frac{1}{j\omega C}},$$

$$\omega^2 LC = 2, \quad \omega^2 (LC)' = 1,$$

$$(LC)' = 0.5 \cdot (LC)$$

Through Equation 2, it is possible to obtain desired values such as values of the inductors and the capacitors for being resonant with, for example, a frequency of 2.35 GHz. Also, half of these values that correspond to half of the LC product can be calculated. Then, by minimizing the capacitor value, a maximum valve of the output current ip+in can be obtained. Accordingly, the amplifier of the last (third) stage of present invention can provide the desired outputs by combining at least one inductor and at least one capacitor without the discrete balun in the outside thereof.

Figure 6:
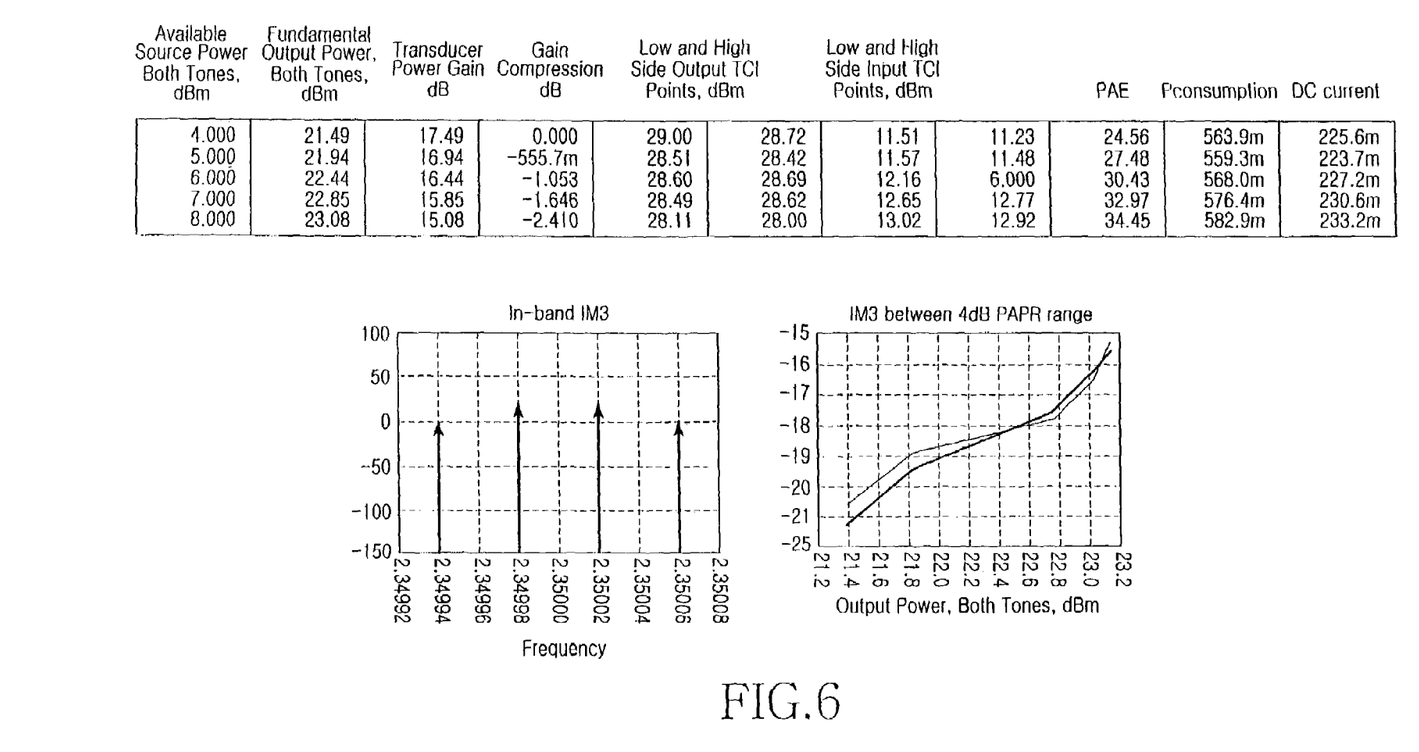
FIG. 6 are charts illustrating a performance of the power amplifier according to one embodiment of present invention, when the power amplifier is operating with a power source of DC 2.5V connected thereto.
Figure 7:
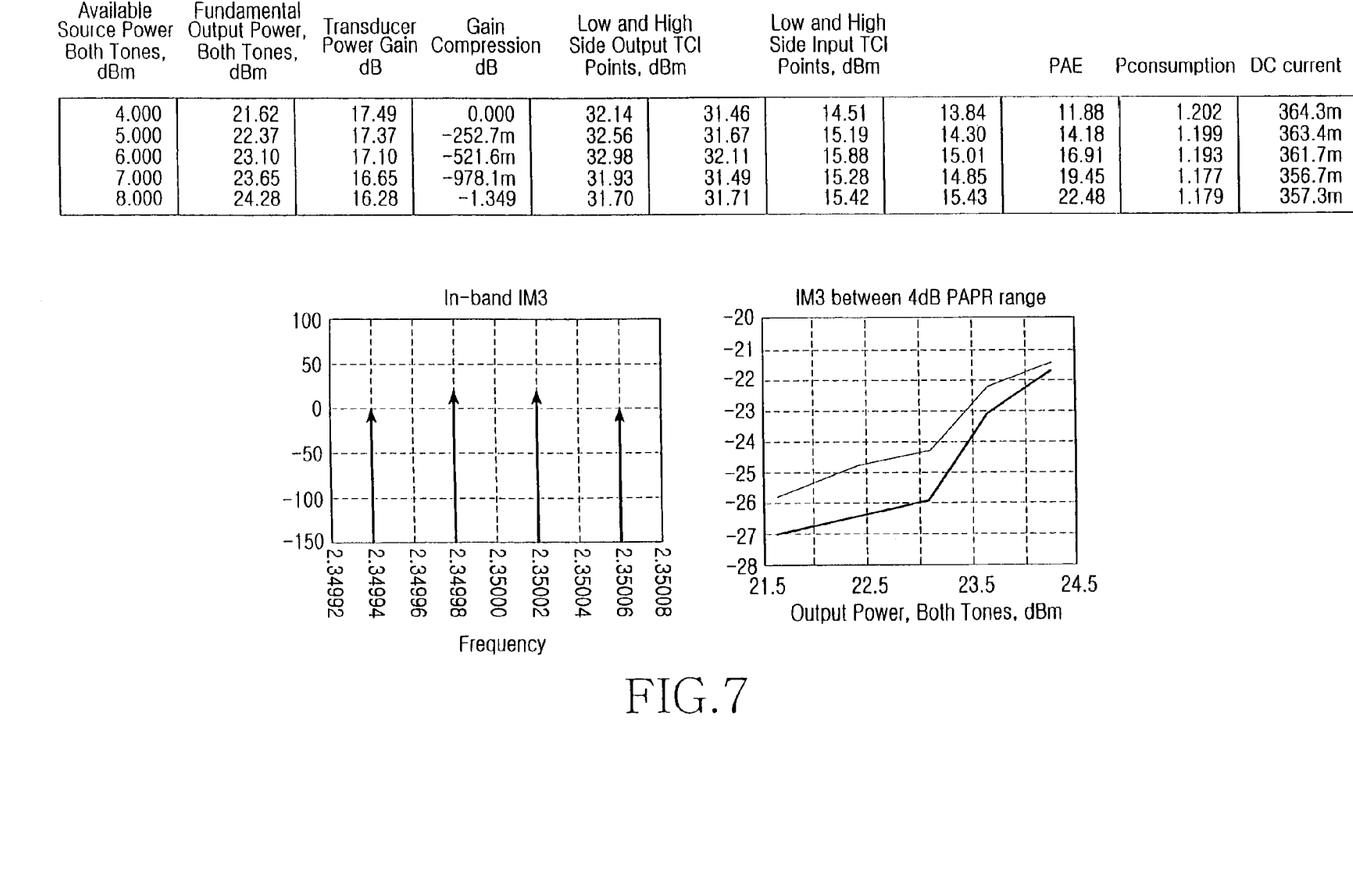
FIG. 7 are charts illustrating a performance of the power amplifier according to one embodiment of present invention, when the power amplifier is operating with a power source of DC 3.3V connected thereto.

The above-described embodiment of the present invention has employed the so-called "0.25 um, 1-poly 5-metal" technology of TSMC (a foundry special company located in Taiwan) for the CMOS process and power amplifiers operable at 2.5V DC power. FIG. 6 are charts illustrating a performance of the power amplifier according to one embodiment of present invention, when the power amplifier is operating with a power source of DC 2.5V connected thereto. When the power amplifier of present invention is operating at DC 2.5V, a current of 227 mA is required for obtaining an output of 2.35 GHz and 21.5 dBm. A Power Added Efficiency (PAE) for it would be 24%. At the same time, the Intermodulation (IM) thereof has a linearity of −21 dBc. A value of a $P_{1\ dB}$ for satisfying a PAPR (Peak to Average Power Ratio) of 10 dB (differentials, 4 dB) was nominally 8 dBm (based on a reference input of 4 dBm) which, however, was reduced by 2 dB to actually become 6 dBm as a result of a simulation test. The problem of the reduced value of the $P_{1\ dB}$ for PAPR can be solved by using a DC input voltage of 3.3V in the power amplifier of present invention. FIG. 7 are charts illustrating a performance of the power amplifier according to one embodiment of present invention, when the power amplifier is operating with a power source of DC 3.3V connected thereto. Referring to FIG. 7, when operated at DC 3.3V, the power amplifier consumes a current of 361 mA which is 120 mA more than that of the DC 2.5V case. However, the saturation power Psat occurs at a point that is 4 dB higher than the reference input point, which can sufficiently meet a standard requirement thereof so that IM3 within 4 dB PAPR range reaches remarkably up to about −20 dBc at an output point of 25 dBm in the power amplifier of present invention.

According to the power amplifier of the present invention constructed as described above, the voltage swings can be satisfactorily and assuredly obtained at the fixed or constant power source voltages which may be DC 2.5 to 3.6 V generally supplied in the portable mobile communication terminals. Also, the present invention can provide a solution for solving the PAPR (Peak to Average Power Ratio) problem caused by a differential structure, and 3 dB (6 dB) less voltage or power swing which are occurring in an OFDM system. The present invention can solve an ACLR (Adjacent Channel Leakage Ratio) problem which is defined as a standard requirement of PA linearity by WCDMA. And in accordance with present invention, the discrete baluns disposed in the outside for switching of the differential-to-single-ended in the conventional power amplifier can be excluded to simplify the on-chip power amplifier, and minimize the losses thereof.

And the power amplifier of present invention can maintain a desired linearity because it has a combination of differential structure and N-P-N structure for effectively adapting itself to relatively higher PAPR signals. Finally, in accordance with present invention, since the baluns or an equivalent thereof can be mounted on chip, number of discrete devices in the out side can be reduced.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A power amplifier, comprising:
   a plurality of CMOS amplifiers of at least two different types which are serially connected in an alternating manner; and
   matching circuits, serially coupled between each respective CMOS amplifier, for impedance matching the CMOS amplifiers of the at least two different types.

2. The power amplifier as claimed in claim 1, wherein the CMOS amplifiers are pseudo-differential amplifiers.

3. The power amplifier as claimed in claim 1, wherein one of the CMOS amplifiers which is connected directly to an output of the power amplifier comprises at least one capacitor and at least one inductor for generating a desired voltage as an output required for the power amplifier.

4. The power amplifier as claimed in claim 2, wherein the CMOS amplifiers are comprised of NMOS and PMOS amplifiers.

5. The power amplifier as claimed in claim 1, wherein the power amplifier comprises three stages.

6. A power amplifier, comprising:
   an NMOS amplifier of a first stage;
   a PMOS amplifier of a second stage;
   an NMOS amplifier of a third stage,
   wherein the amplifiers of the first stage, the second stage, and the third stage are serially connected; and
   a plurality of matching circuits, serially coupled between each respective amplifier stage, for providing impedance matching between the amplifier stages.

7. The power amplifier as claimed in claim 6, wherein the CMOS amplifiers are pseudo-differential amplifiers.

8. The power amplifier as claimed in claim 6, wherein the NMOS amplifier of the third stage includes capacitors and inductors for switching of differential-to-single-ended.

* * * * *